United States Patent [19]
Harris et al.

[11] Patent Number: 5,665,649
[45] Date of Patent: Sep. 9, 1997

[54] PROCESS FOR FORMING A SEMICONDUCTOR DEVICE BASE ARRAY AND MOUNTING SEMICONDUCTOR DEVICES THEREON

[75] Inventors: James Marvin Harris, Terrell; Brigitte Ursula Kiba, Plano; Porter B. Click, Jr., Garland, all of Tex.

[73] Assignee: Gardiner Communications Corporation, Garland, Tex.

[21] Appl. No.: 596,589

[22] Filed: Feb. 5, 1996

Related U.S. Application Data

[60] Continuation-in-part of Ser. No. 254,977, Jun. 7, 1994, Pat. No. 5,596,171, which is a division of Ser. No. 65,579, May 21, 1993, Pat. No. 5,490,279.

[51] Int. Cl.[6] .......................... H01L 21/48; H01L 21/58; H01L 21/60; H01L 21/70
[52] U.S. Cl. ...................... 438/110; 438/113; 438/118; 156/256
[58] Field of Search .................... 437/205, 215, 437/218, 226, 974; 148/DIG. 135

[56] References Cited

U.S. PATENT DOCUMENTS

| | | | |
|---|---|---|---|
| 3,681,513 | 8/1972 | Hargis | 174/52 S |
| 3,784,884 | 1/1974 | Zoroglu | 317/234 |
| 3,836,993 | 9/1974 | Joshi | 357/27 |
| 3,936,866 | 2/1976 | Grossman et al. | 357/80 |
| 3,961,415 | 6/1976 | Davis, Jr. | 29/591 |
| 3,986,196 | 10/1976 | Decker et al. | 357/22 |
| 4,150,393 | 4/1979 | Wilson et al. | 357/74 |
| 4,168,507 | 9/1979 | Yester, Jr. | 357/51 |
| 4,340,902 | 7/1982 | Honda et al. | 357/74 |
| 4,486,622 | 12/1984 | Dathe et al. | 174/52 |
| 4,538,124 | 8/1985 | Morrison | 333/246 |
| 4,618,879 | 10/1986 | Mizukoshi et al. | 357/74 |
| 4,737,236 | 4/1988 | Perko et al. | 156/644 |
| 4,739,389 | 4/1988 | Goedbloed | 357/75 |
| 4,786,256 | 11/1988 | Angeleri et al. | 439/72 |
| 4,788,584 | 11/1988 | Hirano et al. | 357/81 |
| 4,839,712 | 6/1989 | Mamodaly et al. | 357/51 |
| 4,891,686 | 1/1990 | Krausse, III | 357/68 |
| 4,922,324 | 5/1990 | Sudo | 357/74 |
| 5,032,542 | 7/1991 | Kazami et al. | 437/206 |
| 5,102,831 | 4/1992 | Haga | 437/206 |
| 5,275,958 | 1/1994 | Ishikawa | 437/974 |
| 5,499,124 | 3/1996 | Vu et al. | 437/974 |
| 5,563,084 | 10/1996 | Ramm et al. | 437/974 |

FOREIGN PATENT DOCUMENTS

| | | | |
|---|---|---|---|
| 57-45929 | 3/1982 | Japan | 437/974 |

*Primary Examiner*—David E. Graybill
*Attorney, Agent, or Firm*—Harris, Tucker & Hardin, P.C.

[57] ABSTRACT

A method of manufacturing semiconductor devices is disclosed which incorporates an array of bases formed on a plastic sheet. Each base in the array includes individual leads used to connect the semiconductor die to an external circuit. To keep the plastic sheet from flexing during assembly the plastic sheet is placed between a foundation and an anchor grid, where the foundation provides a rigid platform for the plastic sheet and the anchor grid hold the sheet to the foundation. Once the semiconductor dies have been attached to the bases, a protective cap is placed over the die. An adhesive sheet is then place over all the caps in the array allowing the array to be milled to separate the individual packages without scattering the devices.

11 Claims, 8 Drawing Sheets

PROCESS FOR FORMING A SEMICONDUCTOR DEVICE BASE ARRAY AND MOUNTING SEMICONDUCTOR DEVICES THEREON

RELATED APPLICATIONS

The present application is a continuation-in-part of application Ser. No. 08/254,977 which was filed on Jun. 7, 1994 and entitled "PACKAGE FOR A HIGH FREQUENCY SEMICONDUCTOR DEVICE AND METHOD FOR FABRICATING AND CONNECTING THE SAME TO AN EXTERNAL CIRCUIT," U.S. Pat. No. 5,596,171, which is a divisional of application Ser. No. 08/065,579 filed May 21, 1993 and entitled "PACKAGE FOR A HIGH FREQUENCY SEMICONDUCTOR DEVICE AND METHODS FOR FABRICATING AND CONNECTING THE SAME TO AN EXTERNAL CIRCUIT," U.S. Pat. No. 5,490,279.

FIELD OF THE INVENTION

The invention pertains generally to a method of efficiently packaging a semiconductor device so it can be easily placed in electrical circuits and protected from damage during subsequent manufacturing processes.

BACKGROUND OF THE INVENTION

Electronic packaging is a method whereby a discrete semi-conductor device, or die, is encased to protect it from the environment and to provide easy connection of the die to an external circuit. Package materials are chosen for suitable electrical, mechanical or thermal properties. The die is then attached, wired and otherwise assembled into the package. Die such as FETs are widely used in commercial products such as microwave amplifiers, cellular telephones and satellite down-converters. High device performance, reliability and low cost packaging are desirable.

The optimum package for a particular die is determined, in part, by the desired performance characteristics of the current where the die is used. The perfect electronic package can be described as one which is transparent to the die; a package that in no way alters a signal on entering or leaving the die. Any changes to the signal should be due solely to the action of the device inside. The perfect mechanical package must be compatible to die attachment and wire bonding techniques and must have low cost manufacture and easy connection to an external circuit.

Perfect packaging does not exist due to properties inherent to the package materials. These properties include inductance, capacitance and resistance that cause signal changes and they are known as "strays" or "parasitics." At higher frequencies, exceeding 200 KHz, strays cause serious degradation in signal performance. There are several examples of strays; high frequency currents in package conductors generate magnetic fluxes that create a counter current flow. Traditional package conductor leads are made of high-nickel steels which are poor electrical conductors and dissipate signal energy, referred to as "metal losses". The geometry or arrangement of the materials in the package and how it is attached to the circuit also alter the signal. When high frequency signals flow through the several interconnections between the package and the external circuit, the abrupt changes in physical and dimensional properties cause effects commonly referred to as "radiation losses". The non-conductors of the package have capacitance properties which alter the high frequency response of the applied signal.

Perfect packages are difficult to manufacture and use. Traditional ceramic packages with refractory metal bonds have good thermal and mechanical properties but are costly to fashion and undergo time-consuming single line fabrication process. Traditional packages also have non-precise dimensions. Printed and refractory fired packages with inherent thermal shrinkage have wide tolerances and cannot therefore optimize the proximity of package interfaces. Refractory packages also have wide variations in assembly location and electrical connections to external circuits.

SUMMARY OF THE INVENTION

The following summary is intended only to provide a general overview of the various aspects of the invention in its preferred embodiments, methods of manufacture and mode of use, and should not be construed as limiting scope of the invention to all of these aspects.

A package for a very high frequency microelectronic semiconductor device, such as a FET to be used in microwave and UHF circuits, includes a dielectric base. The base is fabricated from a thermo-set plastic, such as a di-functional brominated epoxy sheet filled with fiberglass weave, or thermo-formed plastic, such as random glass fiber filled poly-ether-imide sheet, capable of bonding to metal conductors. Plastic has low material cost and can be fashioned at inexpensive process temperatures as compared with traditional ceramic materials.

Supports are integrally formed on the base to hold metal conductors which electrically connect the device in the package to the external circuit. The size, shape and location of the conductor supports can be formed into the base by several methods, such as punching or molding. Layers of low resistance metals, such as copper, silver, nickel and gold, or alloys thereof, are bonded to the base and conductor supports by several methods, such as plating, vapor deposition or laminating. The term "plating" is used herein to generally refer to such methods. The conductor metals have free electron content such that they are highly conductive and avoid metal losses. Plating and etching resists, such as photo-resist, can be used to further define exact conductor dimensions by chemical milling.

The base with conductors is intended to support and electrically connect a semiconductor device or die. The package is built in an array, such as five rows of five bases, which enables the die attached equipment to step and repeat loading die onto each base. A die is attached to the base by one of several methods, such as epoxy bonding. Low thermal stresses inherent in the plastic allow a wide range of bond materials and thicknesses so that the die is reliably attached. The die is electrically connected to the conductors of the package with metal leads, such as gold wire wedge bonds. The package conductors are made from metals to which gold wire may be bonded. The impedance of the package conductors and wire bonds are substantially matched to the die and the external circuit by several methods, such as varying the number of bond wires or size of the conductors as well as using photographic processes to control the location and proximity of conductors. Minimizing the lengths of the bond wires and proximity of metal conductors reduces parasitic inductance and capacitance. The surface of the die, the bond wire contacts and the surface of the metal conductors are located substantially in the same plane to avoid abrupt physical discontinuities in the signal path through the package. This reduces high frequency radiation losses.

A plastic lid, overlaying the die and attached to the base to protect the die from the environment, is formed by one of several methods. These methods include molding or cold forming. The lid can be attached by several methods such as epoxy, solvent or ultrasonic bonding. Positive registration of the package during subsequent assembly to an external circuit is made by notching the lid, body or conductor. The package can thus be oriented for assembly by such techniques as automated vacuum pick-up tools.

The package is registered to an external circuit and electrically connected, such as by soldering the package conductors to the circuit conductors. Package conductors, such as copper with nickel and gold overlays, are selected for solder wettability during reflow bonding. Solder can be applied in mass by such techniques as screen printing in paste form, and reflow bonded at relatively low temperatures. The proper location and electrical connection of the package to the circuit significantly affects system performance. To avoid abruptness in the signal path between the package conductors and the external circuit, the circuit is designed to accept the package in the same plane as the circuit conductors. For example, the package is flipped and inserted lid down, into a hole formed in the circuit board. The surface of the metal conductors of the package meet and are thus substantially co-planar with the conductors, or transmission liens, on the circuit.

Test data on the packaged devices is fed back to the package manufacture and assembly process such that the process steps can be changed to improve circuit performance. For example, the plating process is easily adapted to alter the thickness of conductors, and the location or number of wire bonds is easily changed without substantially interfering with the package manufacturing and assembly process.

Overall, the package is easily mass-produced by low energy mechanical, electrical and chemical techniques. The package induces minimum losses to the applied signal. The package is built in an array such that maximum index speed of die attach and wire bond machines can be used. And the assembly of the package on an external circuit is fast and accurate.

An alternate embodiment of the present invention provides a method of manufacturing leadless semiconductor packages. An array of bases is formed on a plastic sheet with each individual base including at least two individual leads. Because the plastic sheet is inherently flexible, and therefore, difficult to accurately assemble, the plastic sheet is placed between a foundation and an anchor. The foundation provides a rigid platform allowing accurate assembly of the semiconductor device. The anchor is used to hold the plastic sheet firmly to the foundation. In the preferred embodiment the foundation is a magnet and the anchor is a metallic grid.

Once the plastic sheet is held firmly on the foundation, a semiconductor die is attached to each base using an epoxy or adhesive. The semiconductor die is then electrically connected to the leads using wire and wire boding techniques. Once the semiconductor die is in place and attached, a protective cap, or lid, is placed over the die to protect the sensitive semiconductor die. The cap leaves only the package leads exposed. After the caps are in place an adhesive sheet is placed across the caps of all devices in the array. The plastic sheet is then milled from the side opposite the adhesive sheet to separate individual bases thereby separating the individual semiconductor devices in the array. The adhesive plastic sheet prevents the individual semiconductor devices from scattering during and after the milling process. The adhesive sheet also forms a convenient method of storing and packaging quantities of the semiconductor devices.

BRIEF DESCRIPTION OF THE DRAWINGS

For a more complete understanding of the present invention, and for further details and advantages thereof, reference is now made to the following Detailed Description taken in conjunction with the accompanying drawing, in which.

DETAILED DESCRIPTION OF THE PREFERRED EMBODIMENT

Figure 1:
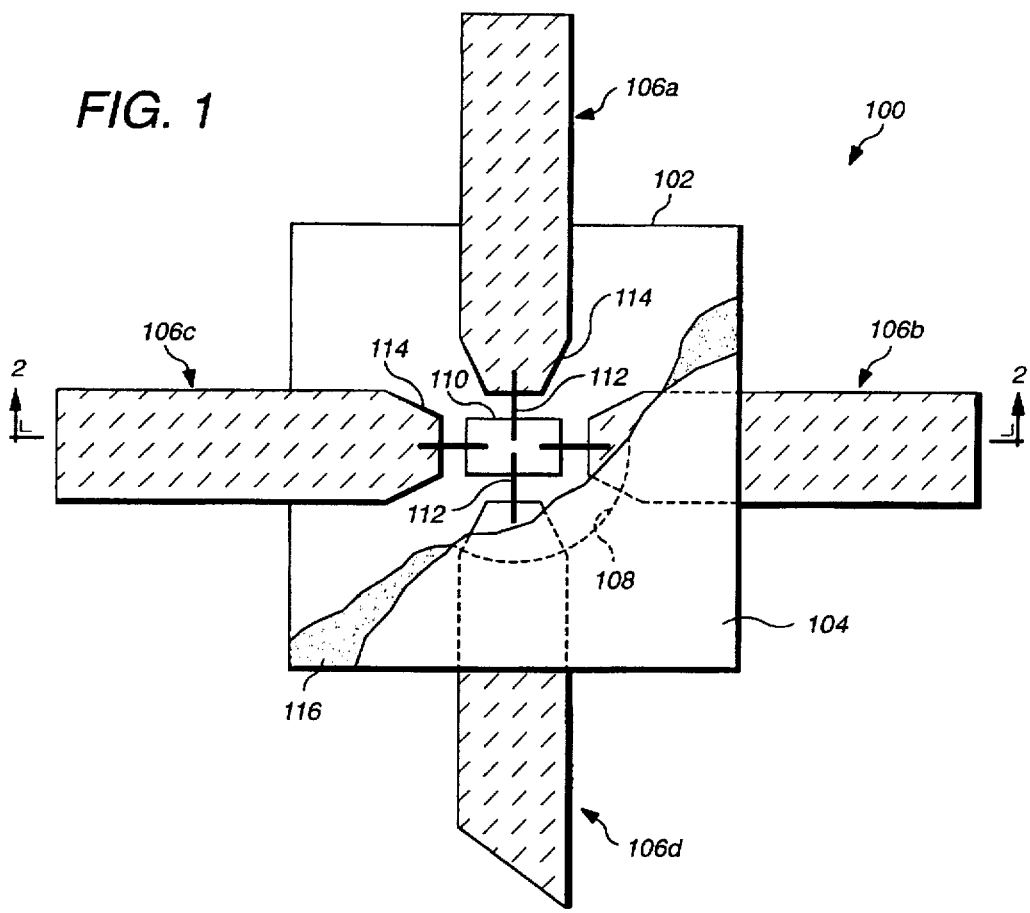
FIG. 1 is a top view of a package for a very high frequency FET with its lid partially cut-away to reveal details of the interior of the package with additional details under the lid indicated in phantom with dashed lines.

Referring now to FIG. 1, shown is top view of a package 100, formed from plastic, to support a semiconductor device, such as a high frequency field effect transistor (FET), used in high frequency circuit applications. The plastic material is easily machined, punched, cold formed or molded. The package includes a base 102, a lid 104 (shown in cut-away view), and metal conductors 106a–106d for electrically connecting the package to an external circuit (not shown). The end conductor 106d is clipped to allow keying the package to a circuit board, ensuring correct orientation of the package. Indicated in phantom by dashed lines, a cavity 108 is formed on the underside of lid 104 for accommodating die 110 and bond wires 112. On die 110 is mounted a microelectronic circuit (not shown in detail). A surface portion 114, called a pad, of each of the metal conductors 106 is located within the cavity 108. The pads are precisely located using photo-resist to plate and etch the metal to exact dimensions. Wire 112 electrically connects the die 110 to pads 114, thereby enabling the die to be electrically connected to an external circuit by means of conductors 106. A line of epoxy 116 bonds the package base 102 and the lid 104 to seal package 100 from the environment.

Figure 2:
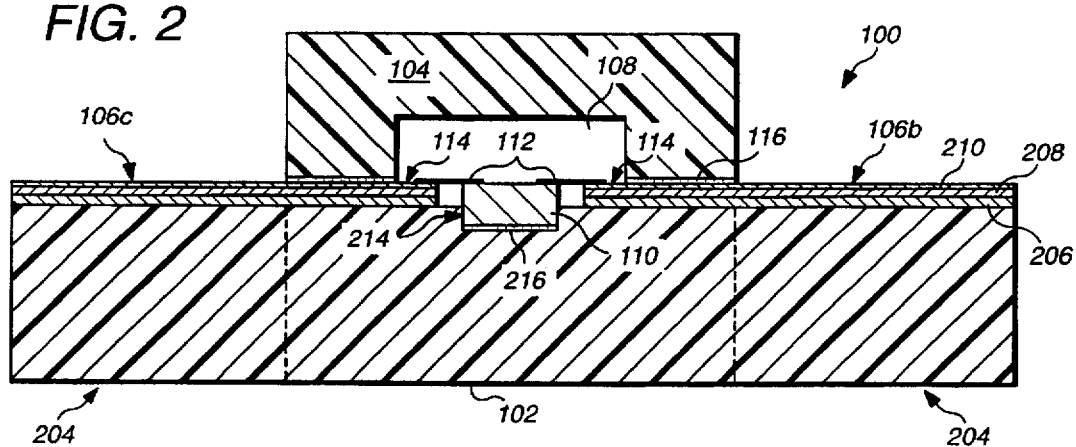
FIG. 2 is a cross-section of the package of FIG. 1 taken along section line 2—2.

Referring now to FIG. 2, a cross section of a package 100 taken along section line 2—2 as shown in FIG. 1 illustrates that the conductor supports 204, on which metal is deposited to form conductors 106, are integrally formed with base 102. The base 102 and the conductor supports 204 are composed of a plastic material that is easily platable with metal. The metals are applied in layers to the top and to the sides (not shown in the cross-sectional view) of the conductor supports 204 for forming conductors 106. The total thickness of the metal is chosen to match the operational frequency of the device or circuit on the die and can be controlled with various well known metallization processes from 0.05 millimeter to 4 millimeters. The width of each conductor is also chosen to match the device or the circuit on the die to the external circuit at the intended operational frequency of the die. The width can be chosen from 1 millimeter to 50 millimeters. On the bottom is a copper layer 206 having a thickness of 0.05 millimeter to 1 millimeter. A nickel layer 208, having a thickness of 0.01 millimeter to 0.1 millimeter is applied over copper layer 206 in order to seal the copper and prevent oxidation, ionic migration or other degradation of the copper. A gold layer 210, having a thickness of 0.01 millimeter to 0.1 millimeter is applied over the nickel layer 208 to provide a suitable surface for gold wire wedge or ball bonding during electrical connection of the die. The three layers of metal extend across the top surface of the base 102 to form pads 114. The pads are in close proximity to die 110 and provide sites for wire bonds that electrically connect the die to the conductors. Base 102 also includes a depression 214 to allow the die 110 to nest inside the base such that the top surface of the die is essentially coplanar to the pads. The die is mechanically bonded to the base with an adhesive 216, such as thermo-set epoxy or silicone adhesive. Bond wires 112, such as 0.025 millimeter diameter soft gold filament wire, electrically connects the device or microcircuit on the die to the pads 114. The number and connected length of bond wires can be optimized to minimize parasitic capacitances and inductances and to match to the impedance of the die. Having the surface of die 110 and the metal conductors 106 substantially coplanar allows for preferred minimum length bond wires. The lid is attached with an adhesive 116, such as epoxy, which covers and protects the die and wire bonds from the environment.

Figure 3:
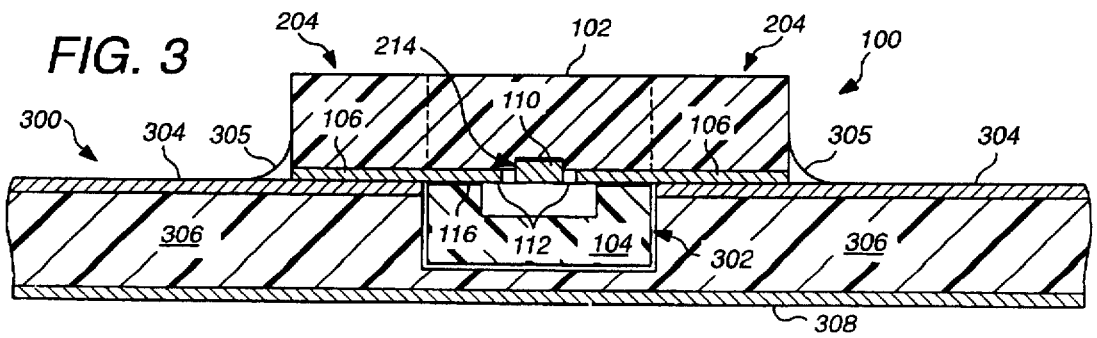
FIG. 3 is a cross-section of the package of FIG. 1, containing a very high frequency FET, mounted to a circuit board.

Referring now to FIG. 3, package 100 is mounted on an external circuit 300 previously formed on circuit board 306 by flipping the package 100 over and inserting lid 104 into a hole 302 defined through the top of circuit board 306. The hole 302 has dimensions only slightly larger than the lid to create a relatively close fit between the lid and the hole and for allowing metal conductors 106 good and complete contact with circuit conductors 304 of circuit 300. Solder 305 is reflowed on circuit conductors 304 and package conductors 106 during mounting of the package 100 so as to provide a mechanical bond of package 100 to the circuit 300 and to provide good electrical contact between the circuit conductors 304 and package conductors 106. The geometry of the package 100 and its mounting to the circuit board 300 provide a preferred co-planar signal path which reduces radiation losses through the assembled circuit board 300. Inserting lid 104 into hold 302 also registers the package 100 to the circuit board 304. Mounting the package in this manner registers it to circuit board and thus provides precise placement of the package on the printed circuit board and holds the package in place during solder reflow. This helps assure consistent performance and aids in mass production of the circuit assembly. Overall, package 100 provides simple installation and interconnection such that it can be used in many other external circuit geometries and is therefore not limited to use in only co-planar or in-hole applications.

Figure 4:
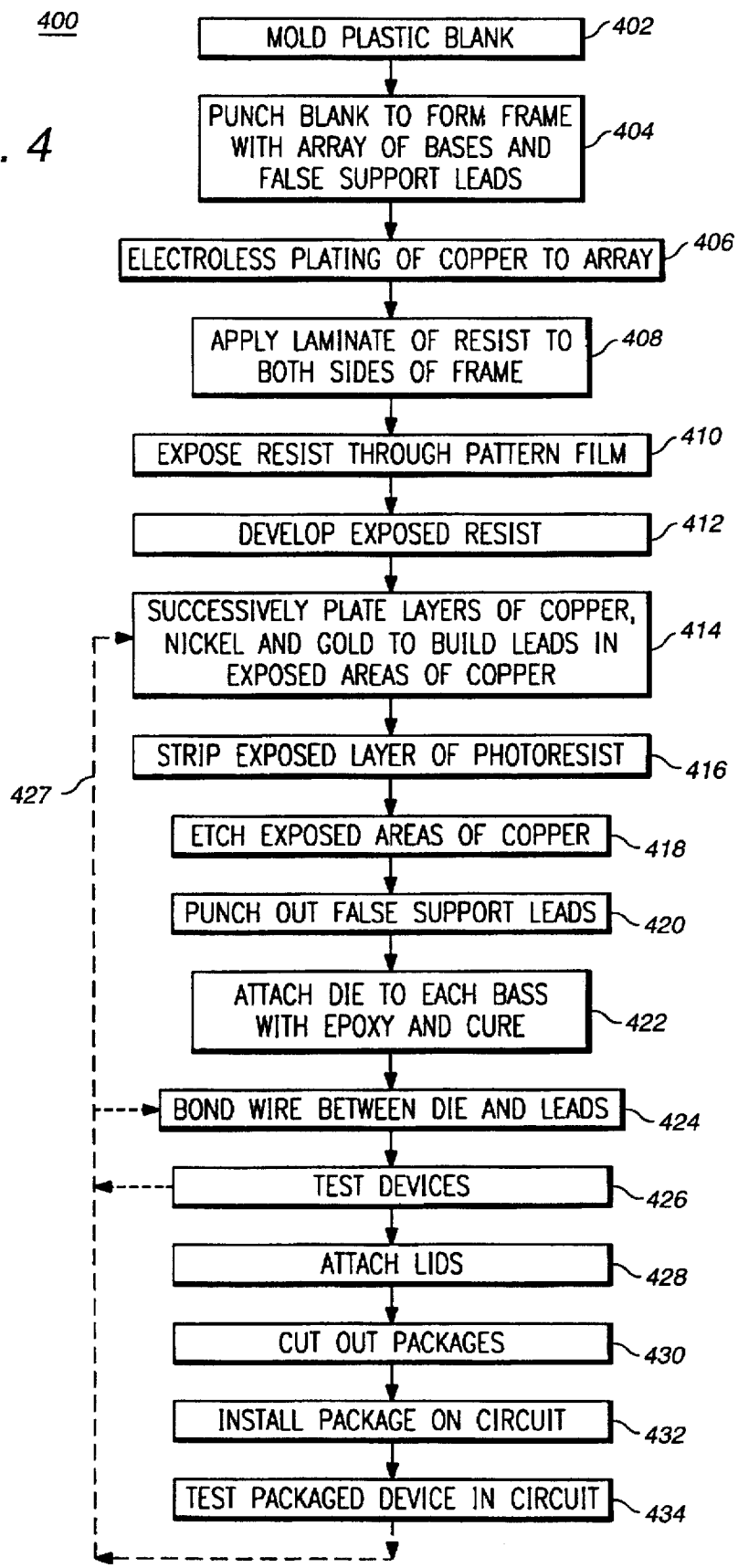
FIG. 4 is a flow diagram of process steps for the manufacture, assembly, test and installation of a package to an external circuit.

Referring now to FIG. 4, the packages are fabricated and assembled as part of an array, according to the process illustrated by flow diagram 400, in order to mass produce packages, thereby reducing manufacturing costs and providing other benefits mentioned herein. Plastic material is the preferred material for forming the package because of low material cost and ease of forming. Plating of metal conductors onto the package provides low cost, highly conductive electrical contacts. Building the packages in an array provides minimum equipment index time and maximum equipment dwell during die attach and wire bond operations. Testing in an array also has superior equipment process times.

Figure 5A:
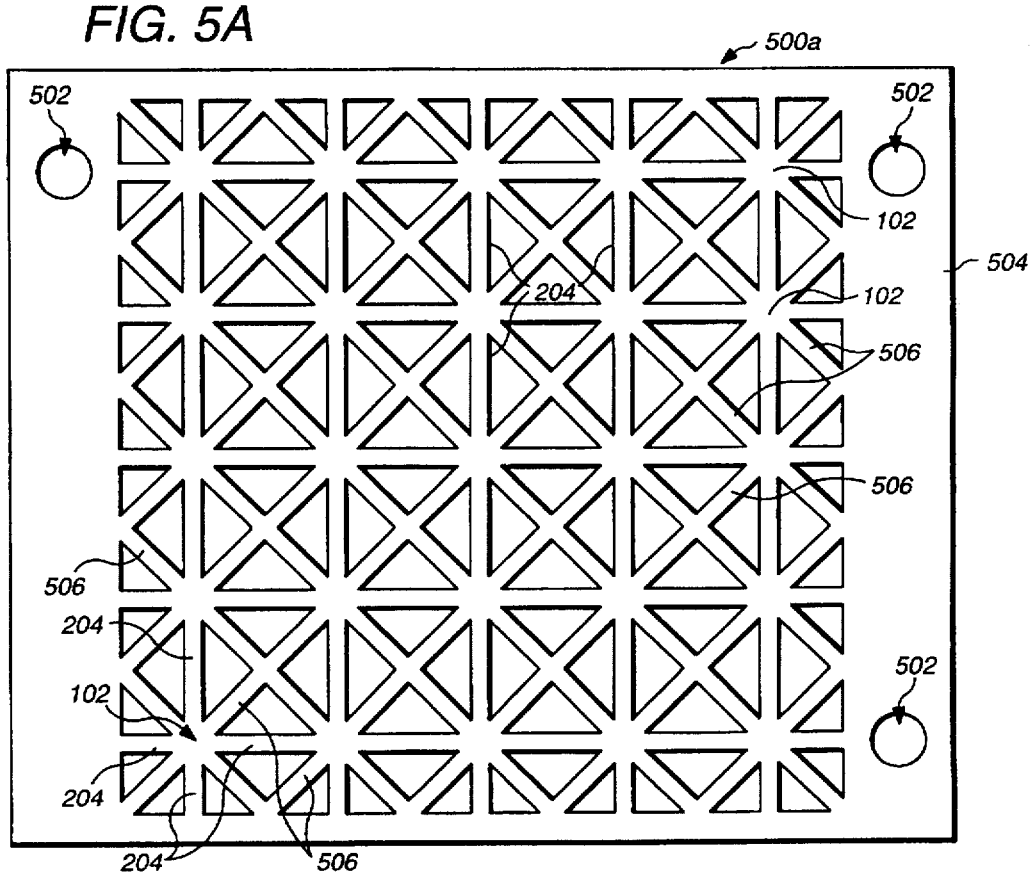
FIG. 5a is a top view of a partially built package array showing the integrally formed base and conductor supports formed by punching a sheet of platable plastic.

At step 402, a plastic blank is molded using conventional processes. Referring now to FIGS. 4 and 5A together, at step 404, the blank is punched to form array 500a of bases 102 with integrally formed and connected conductor supports 204. Alternately, the array can be machined. As an alternative to steps 402 and 404, the array can also be injection molded. Tooling holes 502 are provided in square frame 504 for alignment of packages during subsequent operations to enable close tolerance assembly. False supports 506 extending between bases 102 or between the bases and the frame are provided to restrict metal deposition on the base sides during subsequent plating operations.

Using plastic has several advantages. Package fabrication takes place at low temperatures relative to the temperature required for traditional ceramic packaging. No refractory processing is involved. Plastic is much more easily manipulatable or machinable than ceramic. Plastics encompass materials having a range of favorable properties, for example dielectric constants. This availability allows choosing a plastic that matches the device being packaged and thus easy customizing of the package for each device. Many of these plastics also have good dimensional stability. This stability enables precise location of conductor supports 204 during the punching, machining or molding of the array, as well as subsequent location of die on the base and automated wire bonding of the die to the package leads during process steps that will be described. Finally, conductors may be formed on plastic using a photographic process, rather than the conventional silk-screening process used for ceramic packages. The photographic process provides much freer control and precision, resulting in conductors manufactured to closer tolerances and thus better, more consistent package performance.

Glass filled poly-ether-imide is one such plastic. Ceramic filled poly-ether-imide is a better conductor of heat, but tends to be more brittle and thus difficult to work with.

Figure 5B:
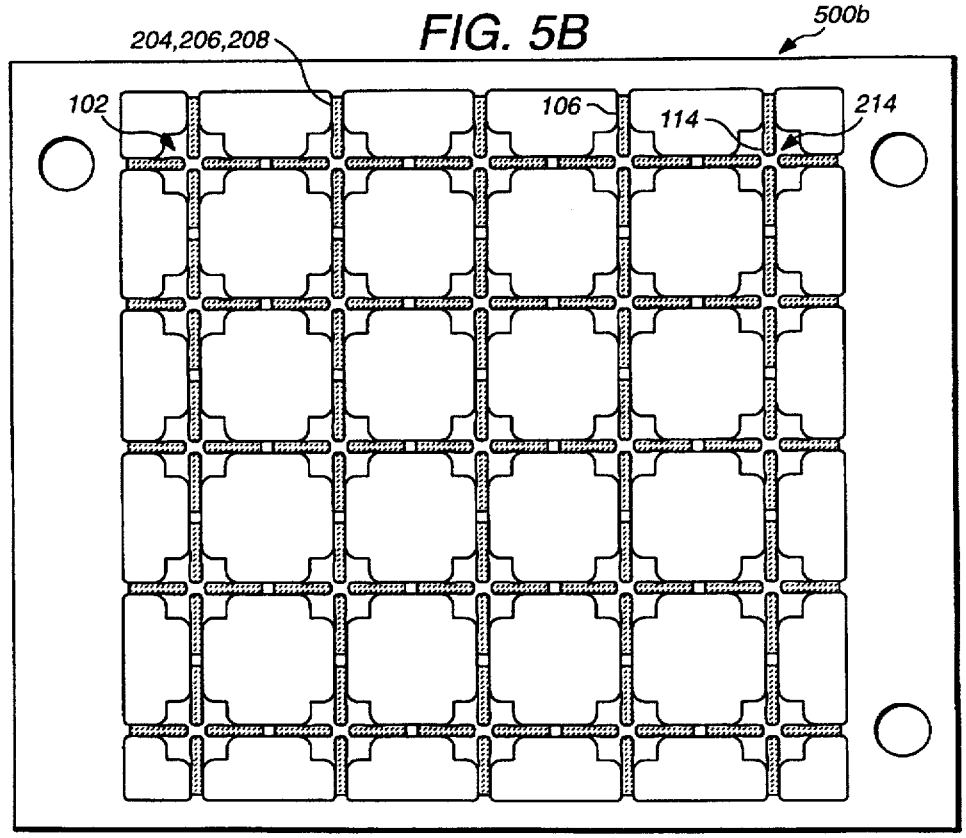
FIG. 5b is a top view of the partially built package array of FIG. 5a showing plated and trimmed metal conductors, die supports and wire bond pads.

Referring now to FIGS. 4 and 5B, Metal conductors 106 are next plated onto the array 500a. The plating starts with an additive process at step 406. All surfaces of the base and conductor supports are metallized with a copper cladding using a method as such as electroless plating. The copper cladding provides an electrical ground plane for subsequent plating operations. An alternate method of providing a ground plane is carbon activation or vapor deposition. However, removing the carbon ground plane is more difficult than etching away copper, resulting in greater risk of shorts between package conductors developing. At step 408, a wet or dry photo-resist is then applied or laminated to each side of the array 500A at a thickness of 0.25 to 1 millimeters, depending of the final, desired thickness of the metal conductors 106. At step 410, the photoresist on each side of the array is exposed with collimated light through a film having the conductor pattern formed thereon. The exposed photoresist is then developed and removed at step 412 to reveal the areas of the copper cladding on which conductors 106 will be formed. Different film patterns may be used to form different conductor geometries or configurations (for example conductor widths) without substantially changing the process of flow diagram 400 or the array 500A. Thus, packages to match other devices, such as those having different impedances or operating frequencies for example, may be inexpensively and quickly designed and fabricated.

At step 414, heavy metal is plated to the revealed underlying copper cladding inside the unexposed areas of the photo-resist, where the exposed photoresist has been developed and removed. First, using a copper bath, a copper layer is plated to the desired thickness, forming copper layer 206 of FIG. 2. Then, nickel is plated on top of the copper layer by immersing the array in a nickel bath and, in a similar process, a gold is plated over the nickel layer, resulting in nickel layer 208 and gold layer 210 of FIG. 2 for the conductors 106.

Next, to finish the conductors, a substractive portion of the process is begun at step 416. The exposed photo-resist is stripped to reveal unplated copper cladding. The conductors 106 are then formed into a final configuration in step 418 by etching away the unplated copper cladding with a copper etchant and revealing the plastic base 102. This additive—subtractive process is precisely controlled to provide close tolerance conductors and requires substantially less energy than other metallizing processes, for example those used to metallize ceramic packaging.

After plating to form conductors 106, array 500b assumes the form shown by punching out false supports 506 at step 420. Punching out the false supports breaks the electrical connection between adjacent conductors on each base formed by metal plated along the sides of false supports due to the two-dimensional photoresist process.

At step 422, the die attach depression 214 is added by pressing a recess into the base area and the die attached to the base. A small amount of epoxy is applied to each die attach area on the base, in a quantity small enough so that the epoxy does not spread across the conductors when the die is attached. A pick and place machine then places each die on the epoxy. An automatic wire bonding machine then, at step 424, bonds wire between each conductor and die.

Before placing lids over each of the die, at step 428, each die is tested at step 426. The results of the test are feedback to plating step 414 and to step 424, as indicated by dashed lines 427, to provide on-line process control. The information allows adjustments to plating thicknesses and the length or number of wire bonds should the packaged devices not be meeting desired performance characteristics. At step 428, attaching the lids involves using a pick and place machine to pick a lid, place the bottom of it in a shallow pool of epoxy, and then place it over the die, as shown in FIG. 1. The lids may be fabricated in a mold or machined from a solid piece of plastic. The lid may also be cold pressed by, for example, pressing a blister in a strip of plastic to form the cavity for the lid.

After package assembly the complete package 100 is punched out at step 430 with one lead clipped at an angle for orientation as shown in FIG. 1. The packages are sorted and loaded for automatic testing using a standard external circuit. As indicated by dash line 427, testing information from the circuit on which the device has been installed is returned to plating step 414 and wire bonding step 424 to be used by plating and wire bonding processes to make any necessary adjustments. The package is then ready for installation on a circuit board at step 432 in the manner, for example, shown by FIG. 3. Packages can be surface mounted similar to standard pick and place with solder reflow methods for high volume, machine assisted assembly.

Figure 6:
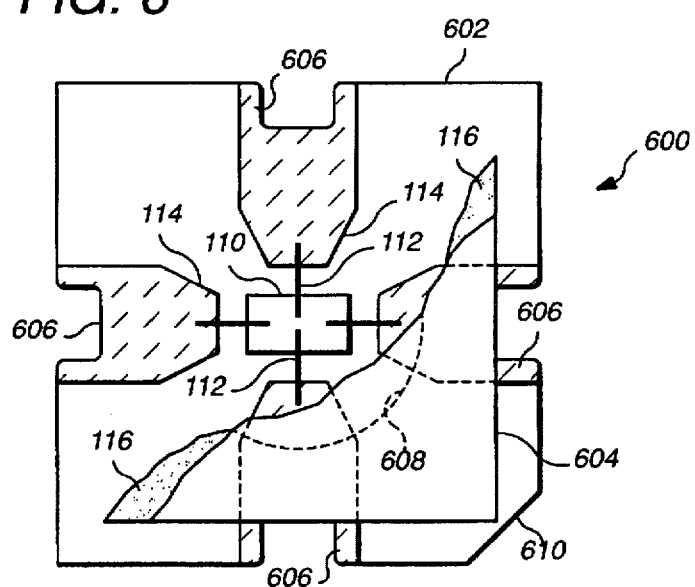
FIG. 6 is a top view of an alternate package configuration with its lid partially cut away.

Referring now to FIG. 6, shown is top view of an package 600 similar to, but having a lead configuration different from, package 100 in FIG. 1. Like package 100, package 600 is formed from plastic in a process substantially similar to that illustrated by FIG. 4, to support a semiconductor device, such as a FET, used in high frequency circuit applications. Package 600 includes a plastic base 602, a lid 604 (shown in cut-away view), and metal conductors 606 for electrically connecting the package to an external circuit (not shown). Indicated in phantom, a cavity 608 is formed on the underside of lid 604 for accommodating die 110 and bond wires 112. Pads 114 on each conductor 606 are located within the cavity 608. Wire 112 electrically connects the die 110 to pads 114, thereby enabling the die to be electrically connected to an external circuit by means of conductors 606. A bond line of epoxy 116 exists between the package base 602 and the lid 604 such that the package 600 is sealed from the environment.

Figure 7A:
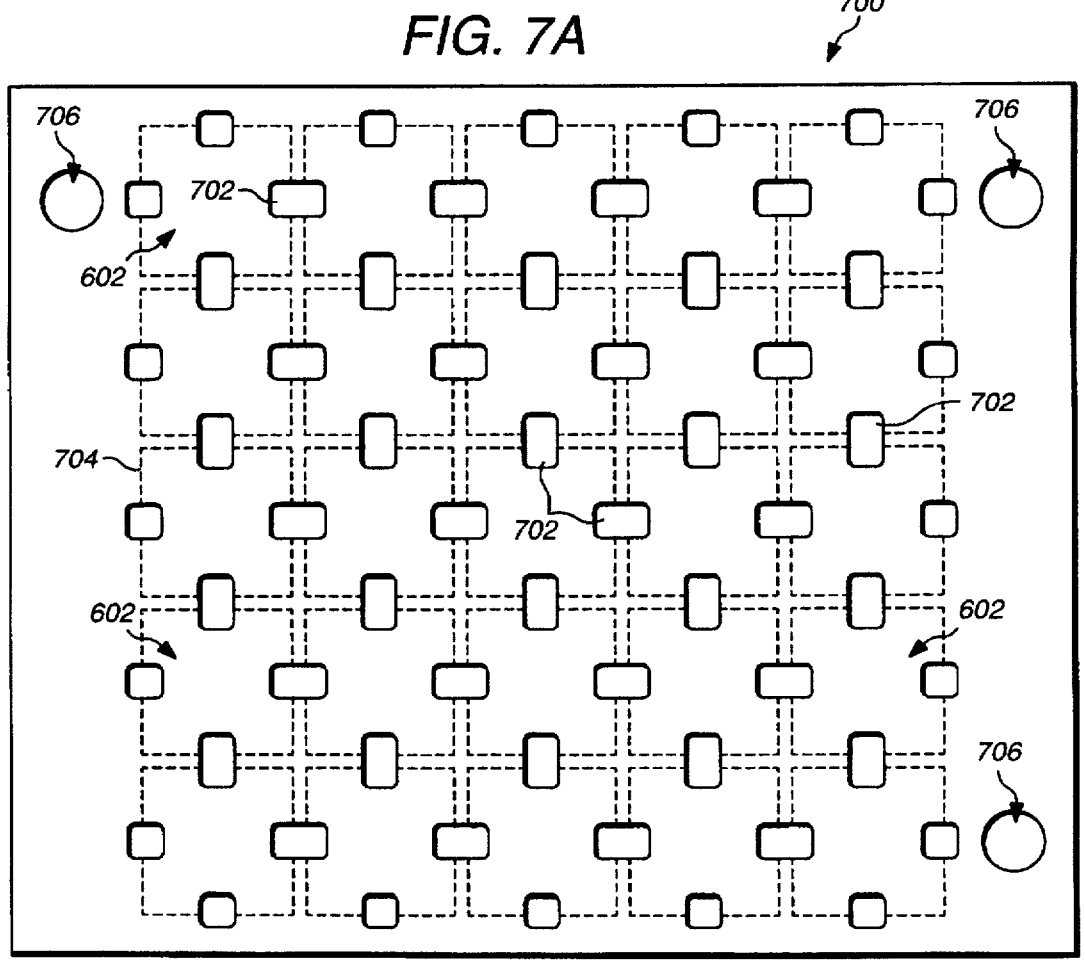
FIG. 7a is a top view of a partially built alternate package array showing the integrally formed base and conductor supports formed by punching a sheet of platable plastic.

Referring now to FIG. 7A, the process of fabricating and assembling package 600 differs from that of package 100, as depicted by FIG. 4, mainly in the configuration of the array of bases and the conductors. An array 700a is formed by micro-milling or punching a plastic blank with an array of generally rectangular slots 702. Dashed lines 704 indicate the periphery of bases 602, where the array will be cut to remove the individual packages. Tooling holes 706 are also provided.

Figure 7B:
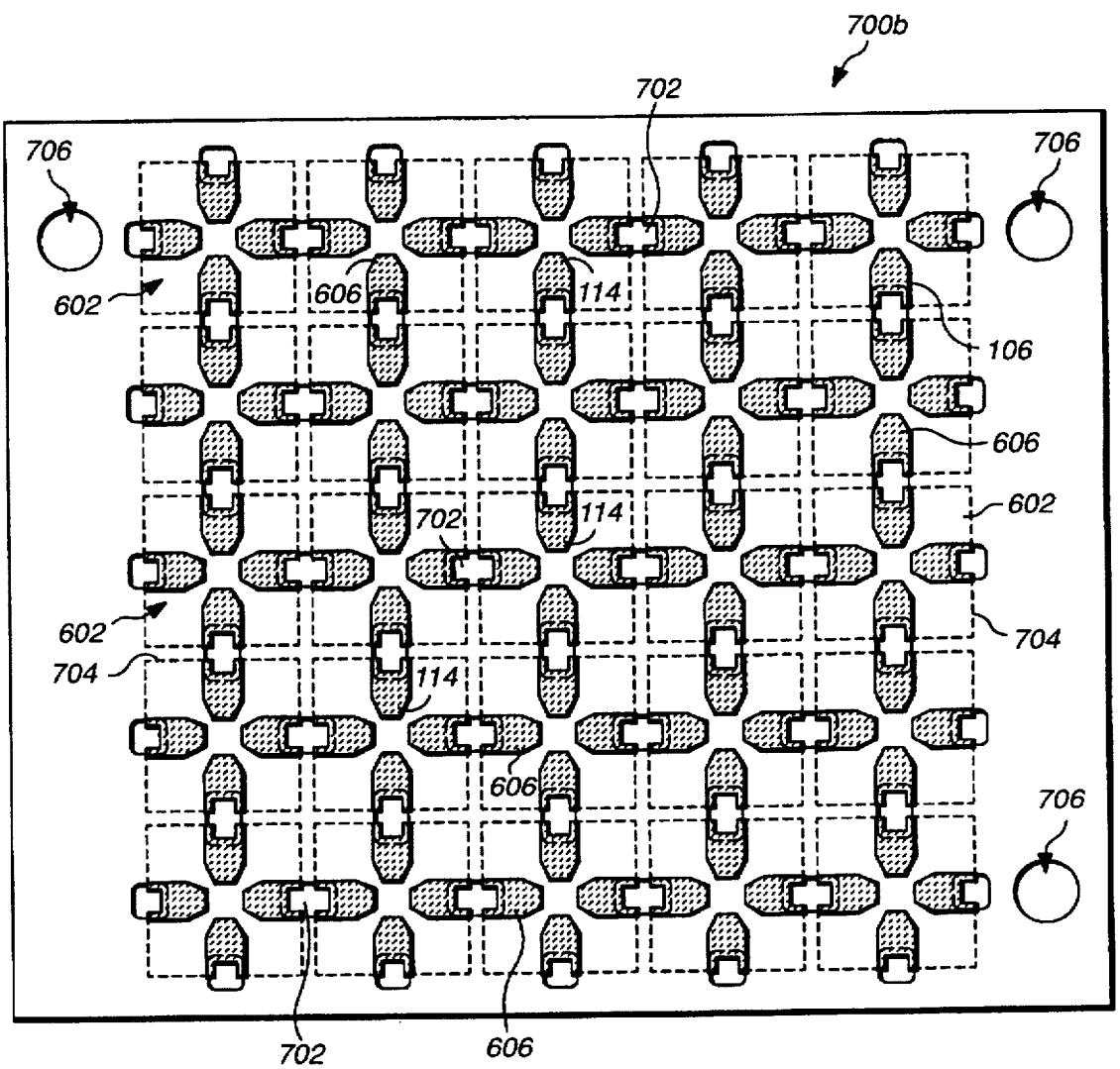
FIG. 7b is a top view of the partially built alternate package array of FIG. 7a showing plated and trimmed metal conductors, die supports and wire bond pads.

Referring now to FIG. 7B, the array is metallized with conductors 606 in the manner described at steps 406 to 418 in FIG. 4. The die is attached and wire bonded to the conductors in the same manner as described in steps 422 and 424. Step 420 is unnecessary as there are no false leads to punch out. Following steps 428–432 of FIG. 4, the packages are tested, the lids attached and then cut out along dashed lines 704. One corner of the base is clipped at an angle for orientation as in 610.

Figure 8:
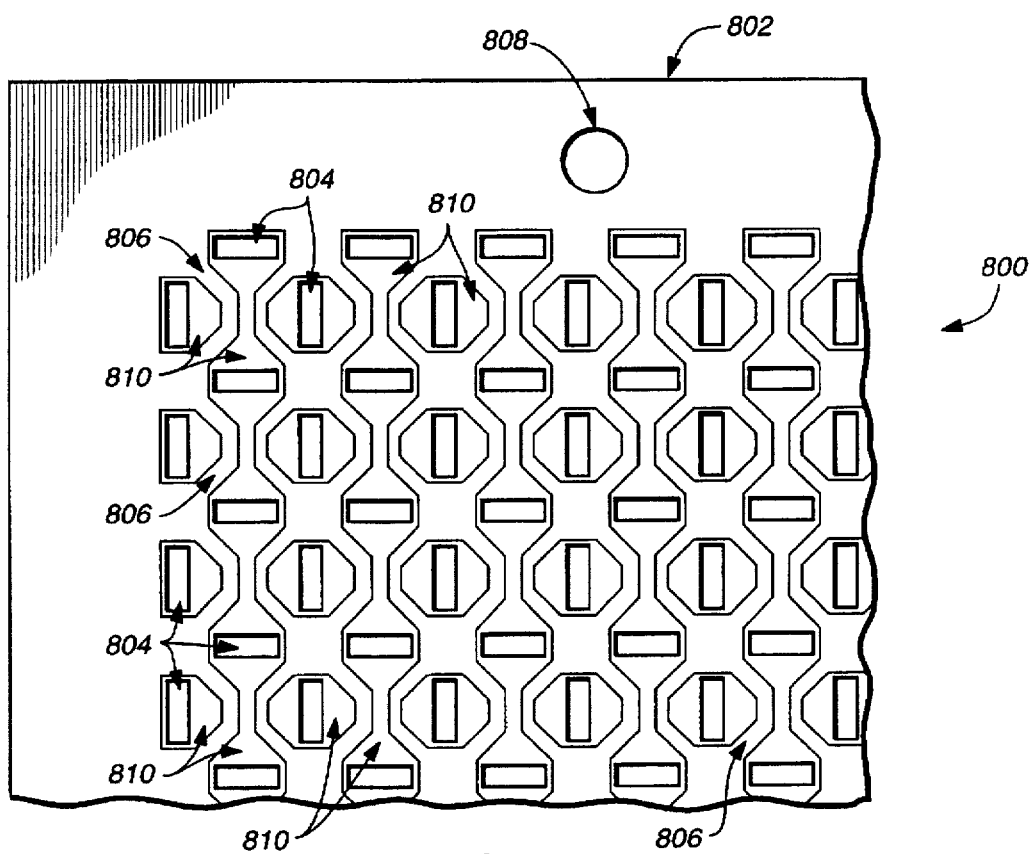
FIG. 8 is an alternative layout of etched and plated substrate prior to the placement of the semiconductor device.

FIGS. 8 through 15 show an alternate embodiment and method of manufacture for leadless packages. FIG. 8 shows array 800 of leadless bases similar to those shown in FIG. 7A, array 800 of FIG. 8, however, is able to be manufactured on a significantly larger scale that the array of FIG. 7A. Array 800 is formed from sheet 802 of platable plastic which has rectangular slots 804 micro-milled or punched into square sheet 802. Rectangular slots 804 are used to define bases 806 and to position array 800 to enable efficient placement of dies (not shown). Tooling holes 808 also help position array 800 for manufacturing purposes. Array 800, as shown in FIG. 8, has already been plated and etched to form leads 810 that are connected to the die with wire bonds preferable using gold wire for performance reasons.

Figure 9:
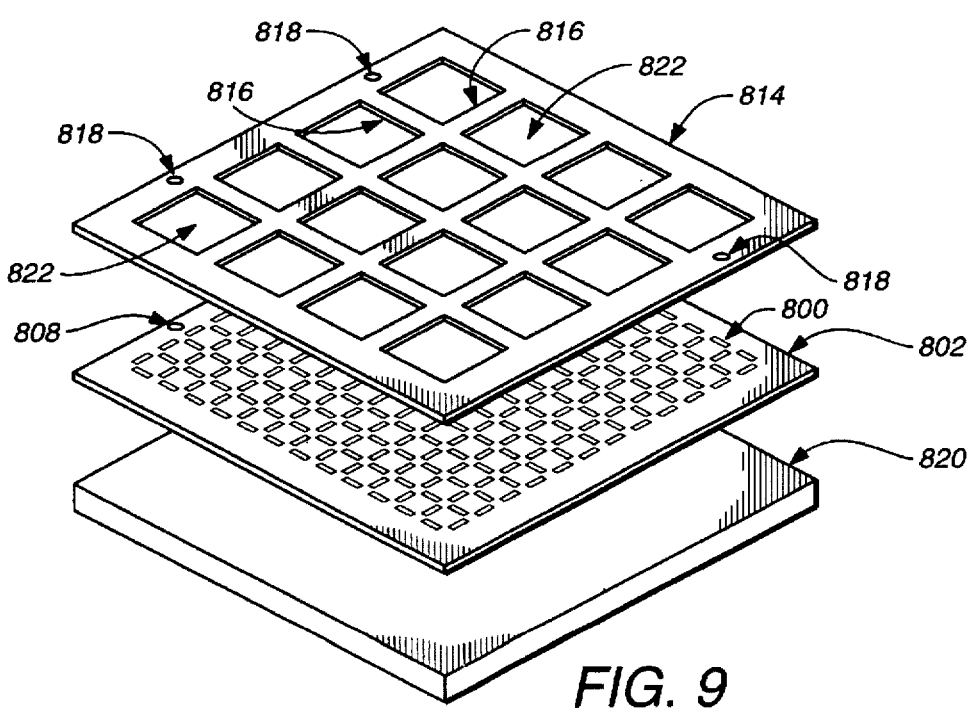
FIG. 9 shows an exploded view of the etched and plated substrate secured between a foundation and an anchor grid.

Because array 800 is formed on platable plastic it is very flexible and, therefore, difficult to work with. FIG. 9 shows a method of mounting array 800 formed on sheet 802 so that is may be accurately positioned and efficiently assembled. Sheet 802 is placed on foundation 820 which is sized to match the dimensions of sheet 802. Foundation 820 acts as a rigid platform which compensates for the flexibility of sheet 802. Sheet 802 is held to foundation 820 by anchor grid 814. Foundation 820 is preferably magnetized and anchor grid 814 is metallic so that anchor grid 814 can be used to secure sheet 802 to foundation 820 by the magnetic attraction of anchor grid 814 to foundation 820. Anchor 814 includes crossmembers 816 which hold the center of sheet 820 flat and firm against foundation 820. Crossmembers 816 form windows 822 which are open and allow access to array 800 on sheet 802. Anchor tooling holes 818 allow anchor 814 to be properly aligned with sheet 802 using tooling holes 808.

Figure 10:
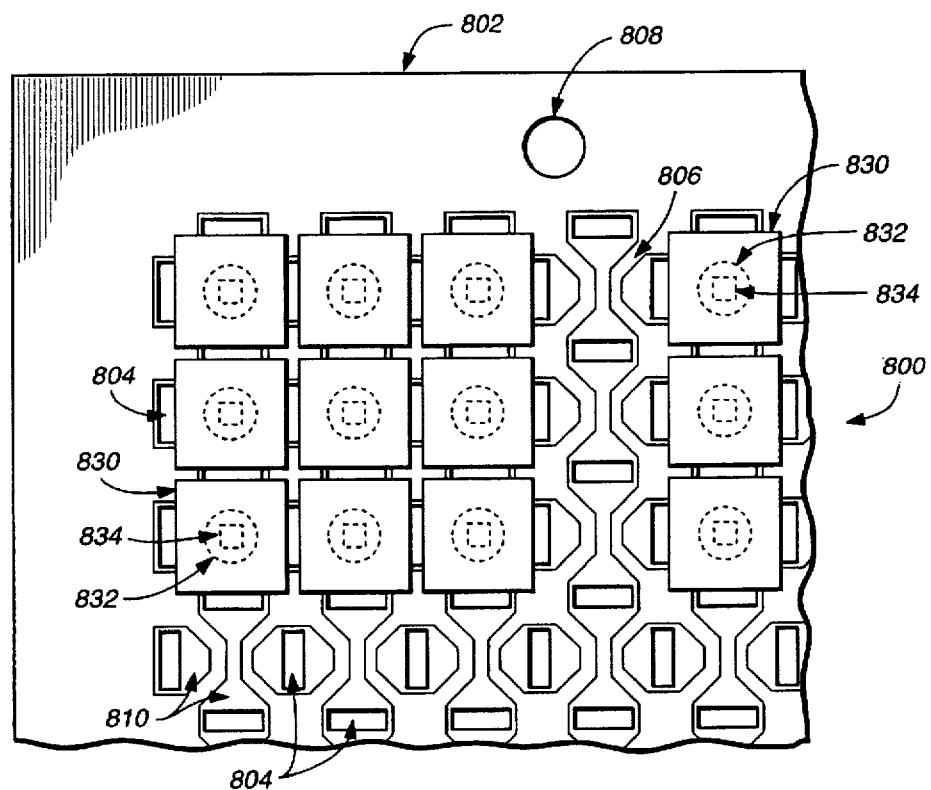
FIG. 10 illustrates the substrate after the semiconductor has been placed and covered.

FIG. 10 shows sheet 802 containing array 800 after cap 830 has been attached. Cap is preferably formed of ceramic in this embodiment for performance reasons, but can be made of plastic. Cap 830 is attached to base 806 and includes cavity 832 shown in phantom. Cavity 832 is used to house die 834 also shown in phantom. Before cap 830 is placed on base 806, die 834 is secured to base 806 using an epoxy or adhesive and attached to leads 810 using a thin wire (not shown). Cap 830 is attached to base 806 using an adhesive or epoxy and acts to protect die 834 and wires from the environment.

Figure 11:
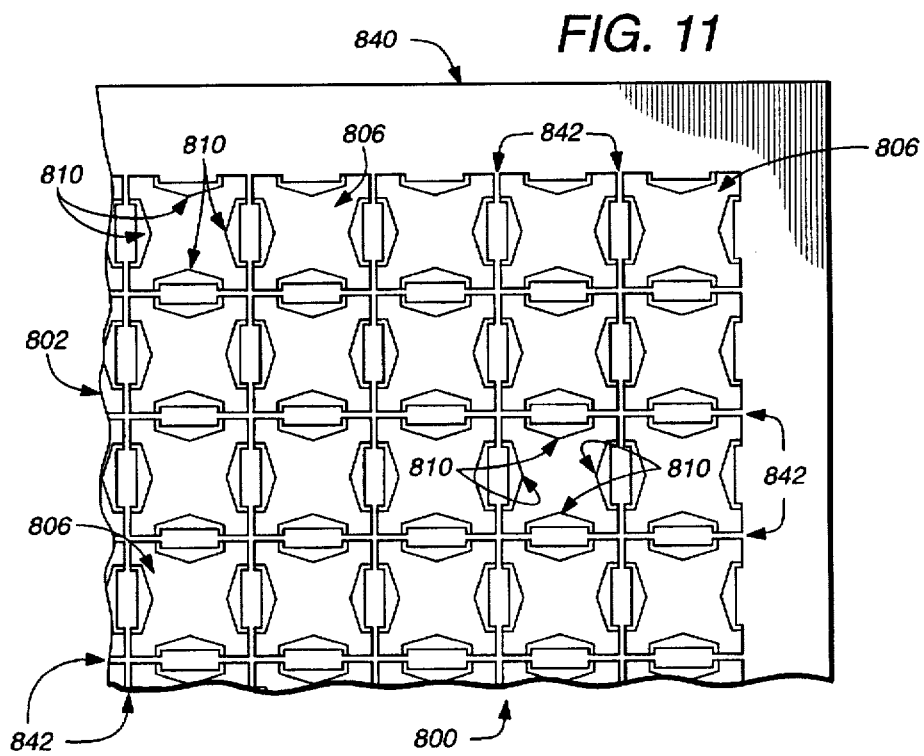
FIG. 11 provides a bottom view of the substrate after it has been cut into individual elements.

Once the dies are placed and attached to the leads, and the caps are secured, the individual packages must be separated. FIG. 11 illustrates the way that the individual packages are separated without scattering the packages. FIG. 11 is a bottom view of array 800 and individual bases 806. Once caps 830 from FIG. 10 have been attached, adhesive sheet 840, which has an adhesive applied to one side, is attached to the caps of the individual packages. Once adhesive sheet 840 is in place, array 800 is milled along cuts 842 to separate bases 806. The milling is deep enough to cut the sheet 802 but not adhesive sheet 840. Using this method allows the packages to be separated but maintained in spatial relationship to each other which is convenient for storing and shipping large numbers of devices.

Figure 12:
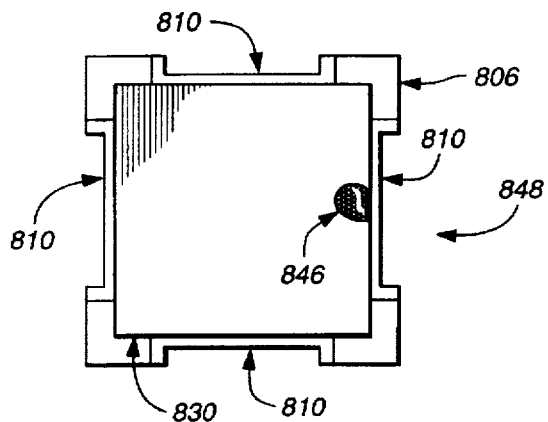
FIG. 12 provides a top view of an individual packaged semiconductor device.
Figure 13:
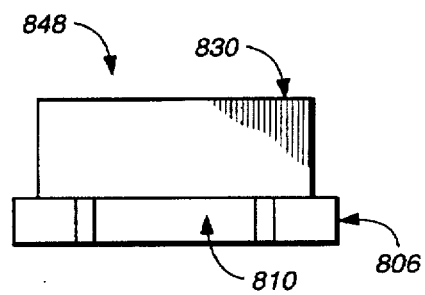
FIG. 13 provides a side view of an individual packaged semiconductor device.
Figure 14:
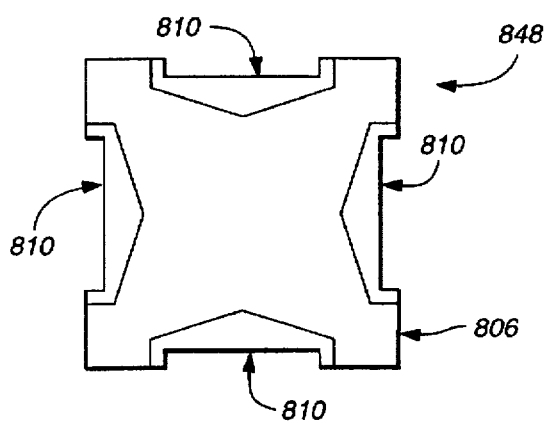
FIG. 14 provides a bottom view of an individual packaged semiconductor device.

FIGS. 12 through 14 shows individual package 848 formed by the method described above with reference to FIGS. 8 through 11. Plastic base 806 includes leads 810 formed by the plating and etching process described above. Cap 830 is attached to base 806 using an adhesive or epoxy and is used to protect the die and connecting wires (not shown). Cap 830 includes mark 846 which identifies the orientation of the die within the package allowing individual package 848 to be properly oriented on a circuit board.

Figure 15:
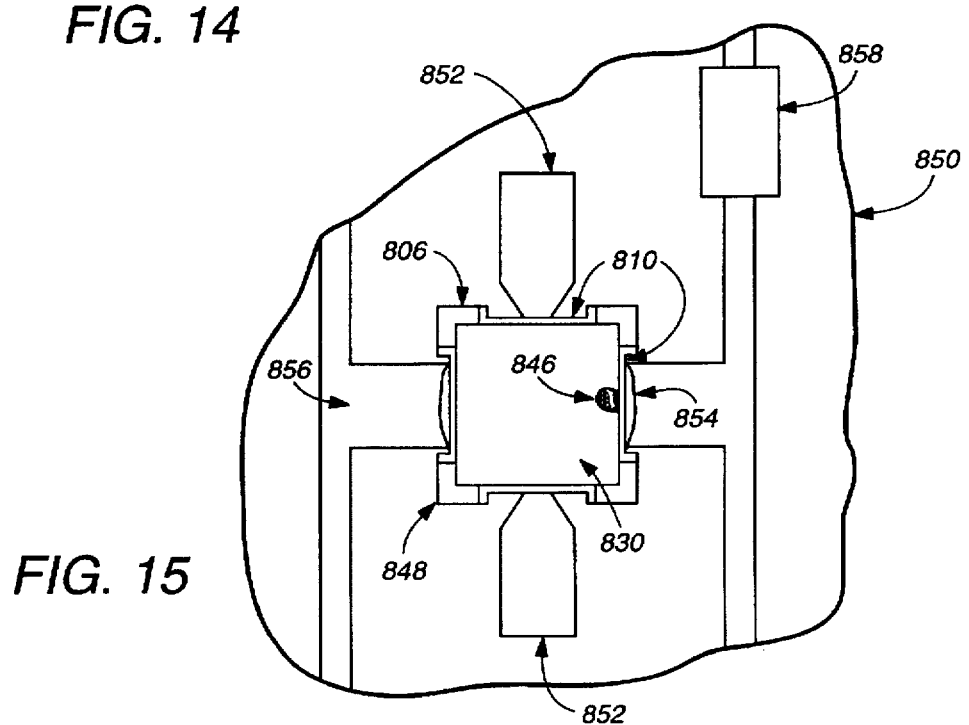
FIG. 15 shows the packaged device connected in a circuit.

FIG. 15 shows individual package 848 from FIGS. 12 to 14 mounted on a circuit board. Circuit board 850 includes pads 852, micro-strip lines 856, and components 858. Individual package 848 is place on circuit board 850 where leads 810 are attached to micro-strip line 856 using solder bond 854.

Only the certain embodiments of the invention have been described. Modifications to these embodiments are possible without departing from the spirit and scope of the invention as set forth in the appended claims.

We claim:

1. A method of packaging a semiconductor device, said method comprising the steps of:
    a) forming an array of bases using a platable plastic sheet which is plated with a conducting material to form individual leads on each base of the array of bases;
    b) attaching individual dies of semiconductor devices on each of the bases forming the array;
    c) capping each of the individual bases with a protective cap;
    d) attaching an adhesive sheet to each protective cap of the array; and
    e) milling the platable plastic sheet from the side opposite the adhesive sheet to separate the individual bases and form separate packaged semiconductor devices, the adhesive sheet maintaining the separate packaged semiconductor devices in a spaced relationship.

2. The method of claim 1 further comprising between steps (a) and (b), the step of:
    ai) placing the platable plastic sheet between a foundation and an anchor, the anchor acting to hold the plastic sheet against the foundation.

3. The method of claim 2 wherein the foundation is magnetized and the anchor is metallic.

4. The method of claim 1 further comprising between steps (c) and (d), the step of marking the protective cap of each separate packaged semiconductor device to indicate the orientation of the semiconductor device.

5. A method of packaging a semiconductor device, said method comprising the steps of:
    a) forming an array of bases using a flexible plastic sheet which is plated with a conducting material to form individual leads on each individual base of the array;
    b) placing the flexible plastic sheet containing the array between a foundation and an anchor;
    c) attaching individual dies of semiconductor devices on each of the bases forming the array;
    d) capping each of the individual bases with a protective cap; and
    e) willing the platable plastic sheet from the side opposite the adhesive sheet to separate the individual bases and form separate packaged semiconductor devices.

6. The method of claim 5 wherein the foundation is a magnet and the anchor is metallic such that the flexible plastic sheet is held to the magnet by the metallic anchor, the foundation providing a rigid platform preventing movement of the flexible plastic sheet during assembly.

7. The method of claim 5 further comprising between steps (d) and (e), the step of marking the protective cap of each separate packaged semiconductor device to indicate the orientation of the semiconductor device.

8. The method of claim 5 wherein the step of forming an array of bases includes the steps of:
    a1) molding a plastic blank;
    a2) plating the plastic blank with a conducting metal;
    a3) punching slots in the plastic blank to form an array of individual bases;
    a4) using photoresist techniques to strip excess conducting metal leaving individual leads on each of the individual bases in the array.

9. A method of packaging a semiconductor device, said method comprising the steps of:
    a) molding a plastic blank;
    b) punching the plastic blank to form an array of individual bases;
    c) plating the array with copper
    d) using photoresist techniques to form individual leads from the copper on each individual base of the array;
    e) plating the copper with layers of nickel and gold to further build the individual leads;

f) placing the plastic blank containing the array between a foundation and an anchor, the foundation providing a rigid platform preventing the plastic blank from flexing;

g) attaching a semiconductor die to each individual base of the array;

h) connecting the semiconductor dies to the individual leads of each base using wire bonding;

i) attaching protective caps over each base;

j) attaching an adhesive sheet to the protective caps; and k) milling the plastic blank to separate semiconductor devices.

10. The method of claim 9 wherein the foundation is a magnet and the anchor is metallic such that the plastic blank is held to the magnet by the metallic anchor, the foundation providing a rigid platform preventing movement of the plastic blank during assembly.

11. The method of claim 9 further comprising between steps (i) and (j), the step of marking the protective cap of each separate packaged semiconductor device to indicate the orientation of each semiconductor device.

* * * * *